(12) United States Patent
Grosser et al.

(10) Patent No.: US 7,777,502 B2
(45) Date of Patent: Aug. 17, 2010

(54) CAPACITIVE PROXIMITY SWITCH, AND DOMESTIC APPLIANCE EQUIPPED WITH THE SAME

(75) Inventors: Jörg Grosser, Bad Abbach (DE); Wilfried Klopfer, Regensburg (DE); Bernward Reinker, Regenstauf (DE); Hans-Jürgen Romanowski, Bernhardswald (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 309 days.

(21) Appl. No.: 12/065,346

(22) PCT Filed: Aug. 17, 2006

(86) PCT No.: PCT/EP2006/065389
§ 371 (c)(1),
(2), (4) Date: Mar. 28, 2008

(87) PCT Pub. No.: WO2007/025866
PCT Pub. Date: Mar. 8, 2007

(65) Prior Publication Data
US 2008/0197909 A1 Aug. 21, 2008

(30) Foreign Application Priority Data
Aug. 30, 2005 (DE) .................... 10 2005 041 112

(51) Int. Cl.
*G01R 27/26* (2006.01)
(52) U.S. Cl. ..................... 324/686; 324/676
(58) Field of Classification Search ............. 324/662, 324/679, 686
See application file for complete search history.

(56) References Cited

U.S. PATENT DOCUMENTS

| 6,734,685 B2 * | 5/2004 | Rudrich ............... 324/661 |
| 7,323,886 B2 * | 1/2008 | Lee .................... 324/679 |

* cited by examiner

*Primary Examiner*—Vincent Q Nguyen
(74) *Attorney, Agent, or Firm*—Laurence A. Greenberg; Werner H. Stemer; Ralph E. Locher

(57) ABSTRACT

A capacitive proximity switch has an electrically conductive sensor surface, which is covered by an electrically non-conductive covering plate and which serves as a part of a capacitor with a capacitance that varies with proximity. A household appliance is equipped with a proximity switch of this type. The sensor surface has an active shielding, which is formed by a shielding surface to which a clock signal is applied at the same time as it is applied to the sensor surface.

17 Claims, 8 Drawing Sheets

CAPACITIVE PROXIMITY SWITCH, AND DOMESTIC APPLIANCE EQUIPPED WITH THE SAME

BACKGROUND OF THE INVENTION

Field of the Invention

The invention relates to a capacitive proximity switch having an electrically conducting sensor surface covered by an electrically insulating cover plate, as part of a capacitor having a capacitance which changes as a result of proximity.

Numerous devices employing capacitive sensors or switches are already known. The present invention relates to a specific configuration of capacitively operating switches, wherein an electrically conducting sensor surface is covered by an electrically insulating cover plate. Thus the user does not touch the sensor surface directly but only approaches said surface by touching the cover plate. The sensor surface is formed by one plate of an open capacitor, the capacitance of which depends on the distance to a second plate (e.g. ground), which is changed for example by proximity of a user's finger.

Such a capacitive proximity switch is already known from DE 695 19 701 T2. Here a semiconductor switch is provided, the signal input of which is supplied with an input signal in the form of a sequence of polarized pulses and which is in a blocked state when idle, i.e. when the proximity switch is not actuated, so there is no output signal present at the signal output of the semiconductor switch. However such a proximity switch has the disadvantage that it is difficult to distinguish actuation by the user from malfunction, for example due to dirt on the cover plate.

BRIEF SUMMARY OF THE INVENTION

The object of the present invention is therefore to provide an improved, economical capacitive proximity switch.

According to the invention the object set out above is achieved with a capacitive proximity switch of the type mentioned in the introduction, in that the sensor surface has active shielding. The active shielding is formed by a shielding surface to which a clock signal is applied at the same time as to the sensor surface. If the sensor surface and the shielding surface adjacent to the sensor surface are supplied at the same time with the most identical clock signal possible or the same clock signal, this has the advantage that no difference in potential develops between the sensor surface and the shielding surface, and there is thus no shifting of charge and thus no capacitive influencing of the sensor surface. This is particularly important in the case of capacitances of the capacitor formed with the sensor surface in the order of picofarads, because in this range even small interfering capacitances from conductors, adjacent sensor surfaces or metal housings for example affect the measurement of the capacitance of the capacitor. By minimizing the influence of such interfering capacitances on the sensor surface with the aid of active shielding, it is possible to dispose the proximity switch near to metal housing parts, even if these are earthed. Also it is no longer necessary to position the sensor surface in direct proximity to the electronic evaluation system of the proximity switch to minimize interfering capacitances but the sensor surface can be disposed at a distance from the electronic evaluation system together with the shielding surface. This makes it possible to execute the sensor surface and connecting lines in the form of a low-cost copper-clad polyester film, having a connection to the electronic evaluation system.

The clock signal is preferably applied to the shielding surface by way of a low-resistance resistor. In this manner the signal form of the clock signal at the shielding surface can be tailored to the signal form of the clock signal at the sensor surface. The clock signal, which is output in particular from an analog output of a microprocessor, is advantageously a periodic clock signal, in particular a rectangular signal, and preferably has a frequency in the range of 10 to 100 kilohertz. This ensures adequate frequency of scanning of the capacitance of the capacitor formed with the sensor surface to detect actuation of the proximity switch. Also there is no need for an expensive, separate frequency generator to generate the clock signal, thereby reducing the number of components required.

According to one preferred embodiment the shielding surface can be connected to ground by way of a switch to apply ground potential. Ground here refers to a fixed potential, for example earth potential or a reference potential of the proximity switch. To function test the proximity switch, in other words to determine a reference value of the output signal, the shielding surface can be connected temporarily to ground by way of the switch, as a result of which the active shielding is temporarily neutralized, and actuation of the proximity switch is simulated. This enables a test of whether the output signal is shifted sufficiently when the proximity switch is actuated, or whether there is a malfunction, which may be attributable for example to dirt or moisture on the cover plate or aging processes of the proximity switch. This allows malfunctions of the proximity switch to be avoided, thereby improving the functional reliability of the proximity switch. In particular an appliance fitted with the inventive proximity switch can be automatically shut off, if reliable functioning of the proximity switch is no longer ensured. In some instances the signal shift of the output signal can be adjusted dynamically by changing the amplitude of the clock signal, in other words the proximity switch can be automatically calibrated.

The switch advantageously has a control signal input, which is connected to a control signal output of a microprocessor. In particular the switch is a transistor, such as a bipolar PNP or NPN transistor, the base of which is connected to the control signal output of the microprocessor. The switch or transistor can thus be switched in a simple manner by way of the microprocessor using a software program, so that automatic function testing of the proximity switch is possible at predetermined times.

The shielding surface and sensor surface can be arranged differently depending on the application. The shielding surface and sensor surface are attached to the rear face of the cover plate for example, with the shielding surface surrounding the sensor surface. In particular the shielding surface and sensor surface can be vapor-deposited, attached by adhesive or printed onto the rear face of the cover plate. Alternatively the shielding surface and sensor surface are disposed on the same face of a support, with the shielding surface similarly surrounding the sensor surface.

In a further embodiment the sensor surface is disposed on the front face of a support and the shielding surface is arranged on the rear face of the support at least in the region of the sensor surface. In this manner the sensor surface can be shielded from power electronics disposed to the rear, in particular in a domestic appliance, such as a washing machine, tumble dryer, dishwasher, cooking appliance, extractor hood, refrigerator, air conditioner, water heater, or vacuum cleaner for example. In particular the support is a printed board, having a sub-region of its front face as the sensor surface and its entire rear face configured as the shielding surface.

According to one preferred embodiment the support is disposed at a distance from the cover plate and an electrically conductive body is disposed between the cover plate and support, bridging the distance and being connected in an electrically conducting manner to the sensor surface and/or forming at least a part of the sensor surface with at least a part of its surface. The sensor characteristics of the sensor surface are transferred from the support to the rear face of the cover plate by means of the electrically conductive body. The shielding surface is insulated against charge changes on the front face of the cover plate, in particular in the event of contact by a user, by the air layer between the support and cover plate.

In another embodiment the support is a flexible printed board or a copper-clad plastic film. Such a support can be tailored to cover plates with a wide range of curvatures, in such a manner that the sensor surface makes positive contact with the rear face of the cover plate over its entire form. Such a support can in particular be printed onto or attached by adhesive to the rear face of the cover plate.

In the preferred embodiment, in which the support is disposed at a distance from the cover plate and an electrically conductive body is disposed between the cover plate and support, bridging the distance and being connected in an electrically conducting manner to the sensor surface and/or forming at least a part of the sensor surface with at least a part of its surface, it has proven particularly favorable to dispose at least one electronic component on the support in such a manner that it protrudes into a cavity surrounded by the electrically conductive body. In particular together with a shielding surface disposed on the rear face of the printed board, the electrically conductive body, which is in particular a compression spring coiled from an extended body, forms a type of Faraday cage for the electronic component, so that said component is shielded from electromagnetic interfering signals in the surroundings. In this manner the semiconductor switch is preferably disposed on the support and shielded from electromagnetic interfering signals, thereby improving the quality of the output signal.

Advantageously, an illuminating element, e.g. an LED, an incandescent lamp, or an optical waveguide, is disposed on the support and protrudes into the cavity surrounded by the electrically conductive body, and/or is disposed in a region defined by the sensor surface. This illuminating element may serve to identify the sensor surface or to signal various switching states of the proximity switch. Also, a marking may be provided, e.g. in the form of a printed image, on the upper face of the cover plate or on its lower face, if the cover plate is transparent, for purposes of identifying the position of the sensor surface.

Preferably a domestic appliance, such as a washing machine, tumble dryer, dishwasher, cooking appliance, extractor hood, refrigerator, air conditioner, water heater, or vacuum cleaner or an input field for a domestic appliance is fitted with at least one inventive proximity switch. Thus the domestic appliance may be fitted with a standard cover panel encompassing the input field, so that the domestic appliance is protected against ingress of dirt or moisture. The cover panel here corresponds to the electrically insulating cover plate and may be made of glass, glass ceramic, ceramic, plastic, wood, or stone, for example. The inventive proximity switch also ensures appliance safety, since the domestic appliance is automatically shut off, if the proximity switch is no longer functional.

According to one preferred embodiment the input field has a number of sensor surfaces, which are connected in a matrix form for operation in a multiplex method. The high frequency of the clock signal ensures adequate frequency of scanning of the capacitances of the capacitors formed with the sensor surfaces to determine actuation by a user. The use of just one clock signal has the advantage that only one clock signal emitter is required.

In a further embodiment at least two sensor surfaces are disposed adjacently and together form a position sensor, in particular on the rear face of the cover plate or on a common support. Depending on the position in relation to the sensor surfaces in which actuation by the user is detected based on the output signals associated with the sensor surfaces, it is possible for different switching states to be triggered. A slide switch can thus be formed without mechanically movable elements, in that the user for example passes a finger over a region of the cover plate or cover panel assigned to the position sensor.

It should be noted that the features of the subclaims can be combined with each other in any way without deviating from the idea according to the invention.

BRIEF DESCRIPTION OF THE SEVERAL VIEWS OF THE DRAWING

The invention is described in more detail below, with reference to the drawings, in which.

DESCRIPTION OF THE INVENTION

Figure 1:
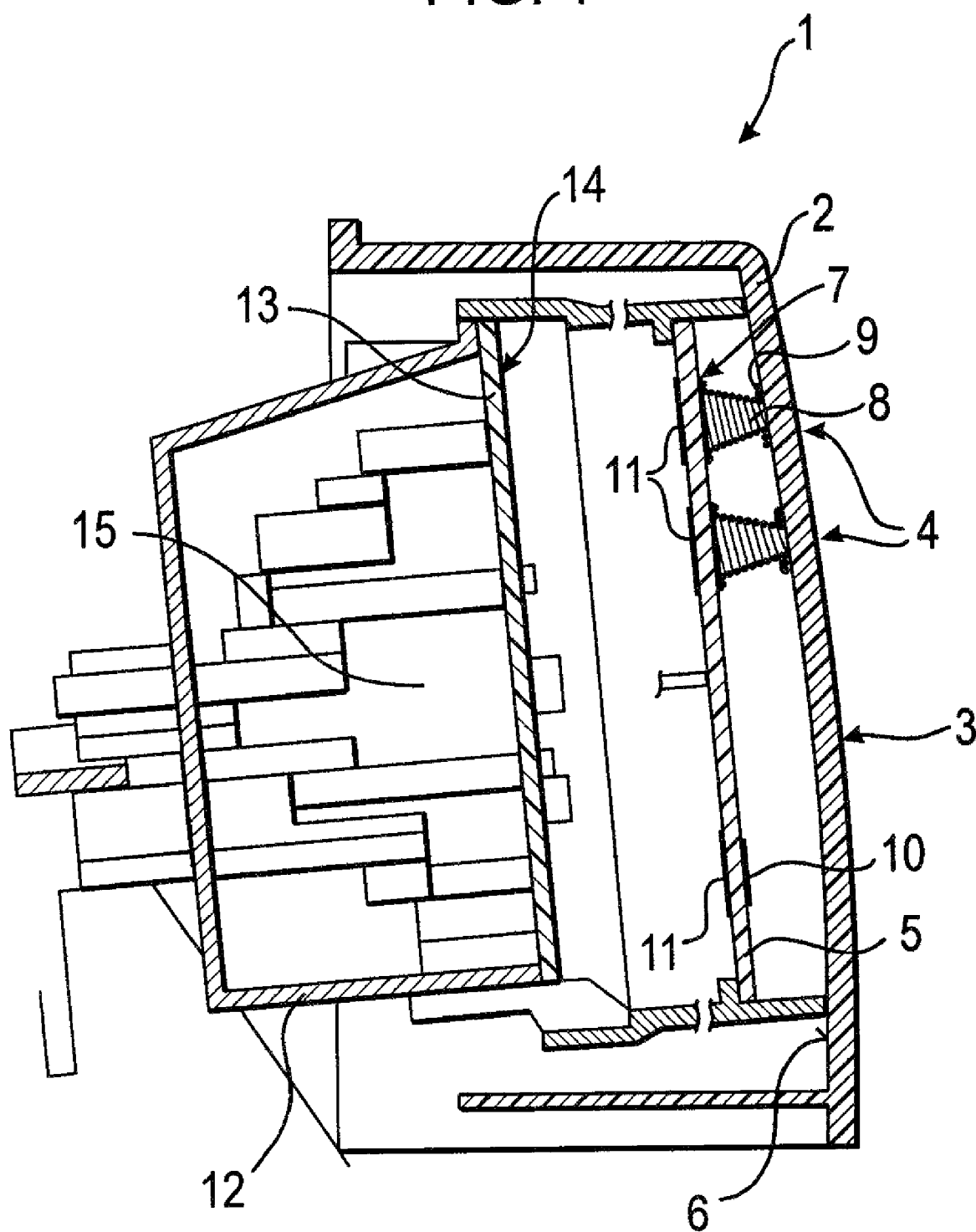
FIG. 1 shows a schematic cross-sectional view of a segment of a domestic appliance having a cover panel, which has an inventive input field.

Before proceeding to the description of the drawings, it should be noted here that identical reference characters have been used to represent corresponding or identical elements or individual parts in the various embodiments of the inventive capacitive proximity switch in all the figures. Where a plurality of elements or individual parts of the same type are used in a drawing and it is sought to differentiate between them, (an) identical figure(s) is/are respectively selected for the initial digit(s) of the corresponding reference character. The subsequent digits of the corresponding reference characters serve to distinguish elements or individual parts of the same type.

FIG. 1 shows a schematic cross-sectional view of a segment of a domestic appliance 1 with a cover panel 2 which has an inventive input field 3. The cover panel 2 is an electrically insulating cover plate made of a dielectric material, e.g. glass, glass ceramic, ceramic, plastic, wood or stone. The input field 3 contains a plurality of capacitive proximity switches 4 of like structure, of which only two are shown here and of which only one is described below. A printed board 5 with an electrically conductive sensor surface 7 facing the rear face 6 of the cover panel 2 is disposed at a distance from the cover panel 2. The printed board 5 may be a plastic board, which has the above-mentioned sensor surface 7, and optionally printed conductors, for electrically conducting connection of the sensor surface 7 to an electrical circuit 14 of the proximity switch 4 (see FIGS. 4, 5 and 6), on at least one of its board faces. The electrically conducting layer of the sensor surface 7 may be configured in various forms, for example circular or square, continuous, lattice or frame-like.

An electrically conductive body in the form of a coiled compression spring 8, preferably made of spring wire, is disposed between the cover panel 2 and the printed board 5. The compression spring 8 has a flat coil disk 9 at its upper end, consisting of a plurality of coils, which are spirally nested and positively tailored to the slightly arched shape of the rear face of the cover panel 2 due to the compressive stress to which the compression spring 8 is subject. On its lower end, the compression spring 8 has a lower coil 9', with which it rests flatly against the sensor surface 7 of the printed board 5 and is for example soldered or adhesively attached to the sensor surface 7 of the printed board 5 there or with which it rests firmly against the sensor surface 7 of the printed board 5 only due to compressive stress, so that there is an electrically conducting connection between the compression spring 8 and the sensor surface 7 of the printed board. Through this electrically conducting connection, the sensor characteristics of the sensor surface 7 are transferred from the printed board 5 to the rear face 6 of the cover panel 2 and the compression spring 8 for its part then forms at least a part of the sensor surface 7, particularly with its coil disks (9, 9'). The electrically conductive body may have other forms, e.g. cylindrical, conical, or rectangular and/or may be configured from other electrically conductive materials, e.g. electrically conductive plastic or a plastic with a metallic core, instead of being a coiled metal compression spring 8.

An electrically conducting reference sensor surface 10 is disposed on the same face of the printed board 5 on which the sensor surface 7 is located, in other words on the front face of the printed board 5 facing the rear face 6 of the cover panel 2. Like the sensor surface 7, the reference sensor surface 10 is connected in an electrically conductive manner to the circuit 14 of the proximity switch 4. An associated reference sensor surface 10 may be provided for each of the sensor surfaces 7 or a common reference sensor surface 10 may be provided for a plurality or all of the sensor surfaces 7. In contrast to the sensor surface 7, the reference sensor surface 10 lacks the electrically conductive compression spring 8, thus the reference sensor surface 10 is electrically insulated with respect to electrical charges and charge changes on the front face of the cover panel 2, by the air layer between the printed board 5 and the cover panel 2.

Figure 2:
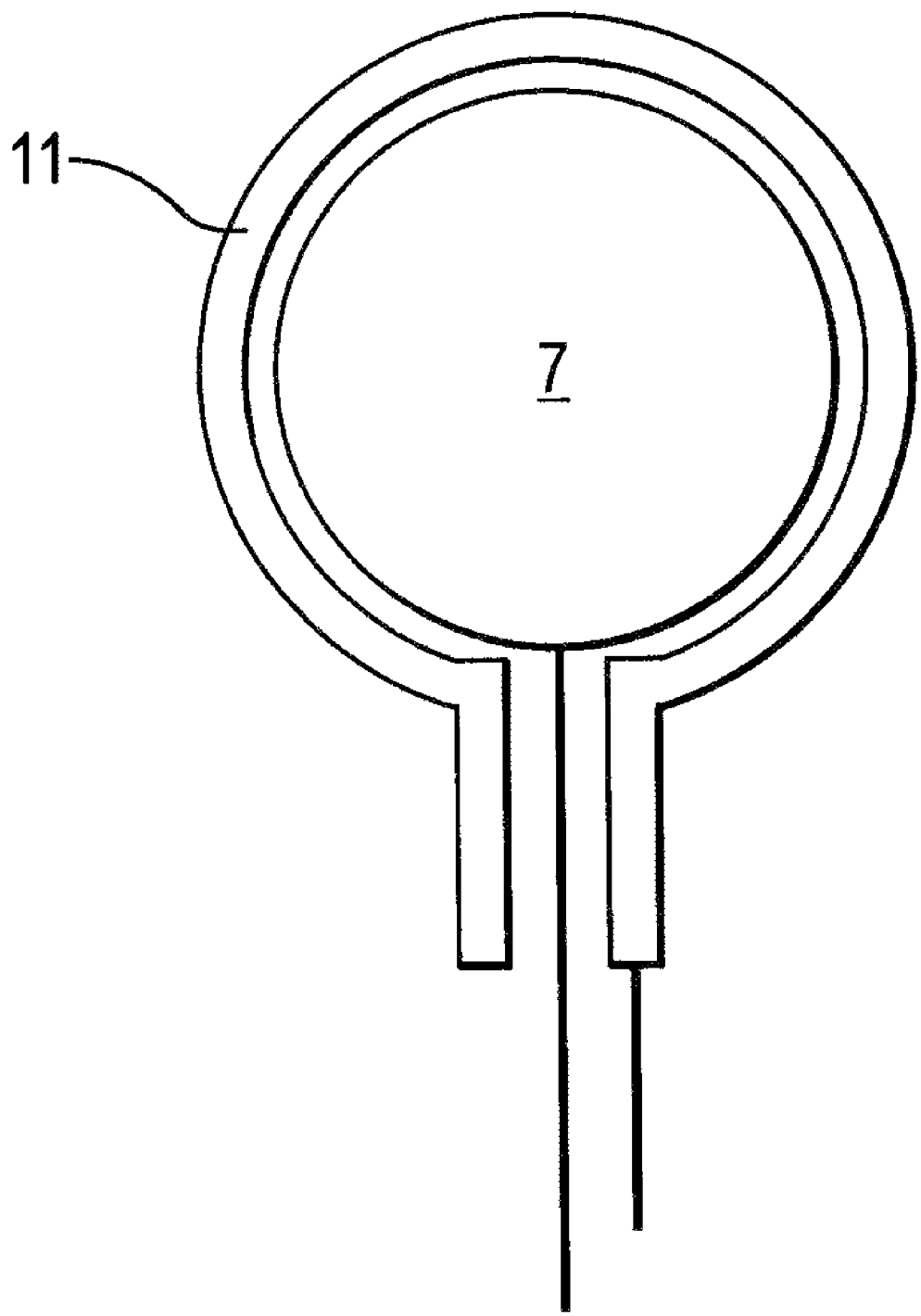
FIG. 2 shows a schematic front view of an embodiment of a sensor surface with a shielding surface framing the sensor surface.

An electrically conducting shielding surface 11 is disposed on the rear face of the printed board 5, at the position of the sensor surface 7 and/or the reference sensor surface 10, its mode of operation being described below in connection with FIG. 5. Instead of individual shielding surfaces 11 for each sensor surface 7 or reference sensor surface 10, a single shielding surface may be provided, which extends over the entire rear face of the printed board 5 or which at least covers the region on the rear face 6 of the printed board 5, which comprises the sensor surfaces 7 or reference sensor surfaces 10. In particular, the printed board 5 may comprise a flexible printed board or a copper-clad plastic film. According to a further alternative embodiment shown in FIG. 2, the sensor surface 7, which is circular here, and the shielding surface 11 are both being located on the front face of the printed board 5. The shielding surface 11 here is formed by an electrically conductive layer which surrounds the sensor surface 7 in the manner of a frame, the form of said frame being tailored to the outer contour of the sensor surface 7.

The electrical circuit 14 of the proximity switch 4 may be disposed on the front face or rear face of the printed board 5, or on a separate board. A common circuit 14 may also be provided for a plurality of or all the proximity switches 4. In the embodiment illustrated in FIG. 1, an electronics module 12 is disposed in the rear region of the printed board 5, having a board 13, which has the circuit 14 of the proximity switch 4 on its front face facing the printed board 5 and is fitted with the power electronics 15 of the domestic appliance 1 on its rear face. This board 13 is connected in an electrically conducting manner to the printed board 5 (not shown).

Figure 3A:
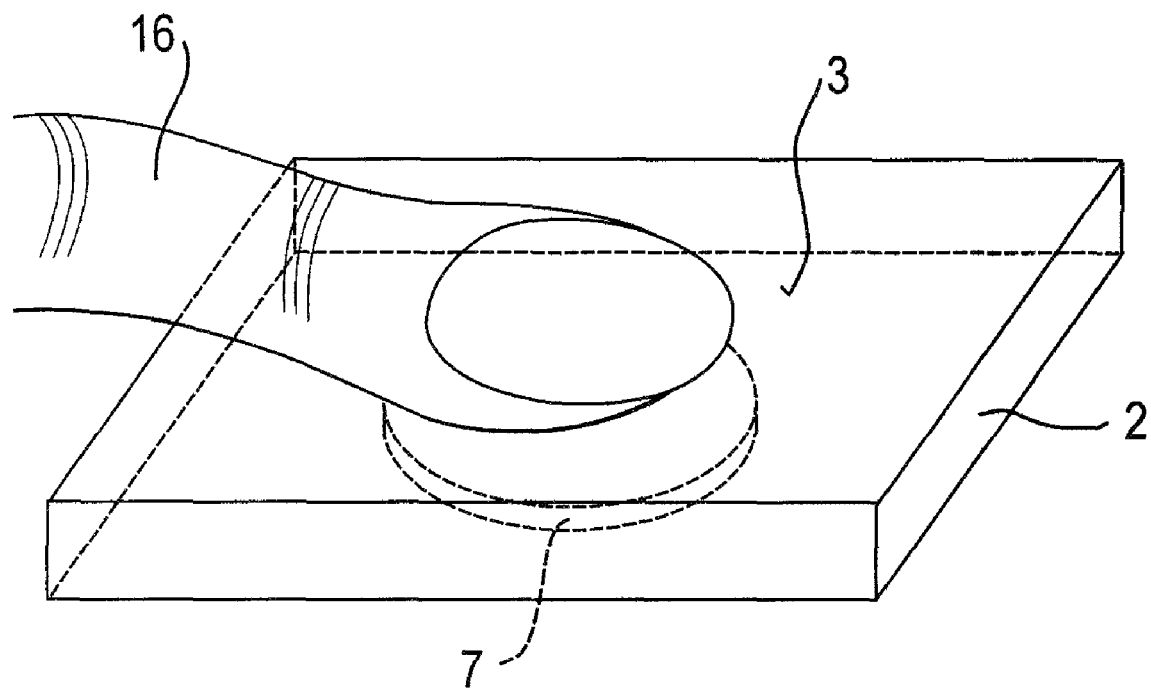
FIGS. 3a and 3b show schematic views of a segment of the input field according to FIG. 1, with actuation of an inventive capacitive proximity sensor by a user.
Figure 3B:
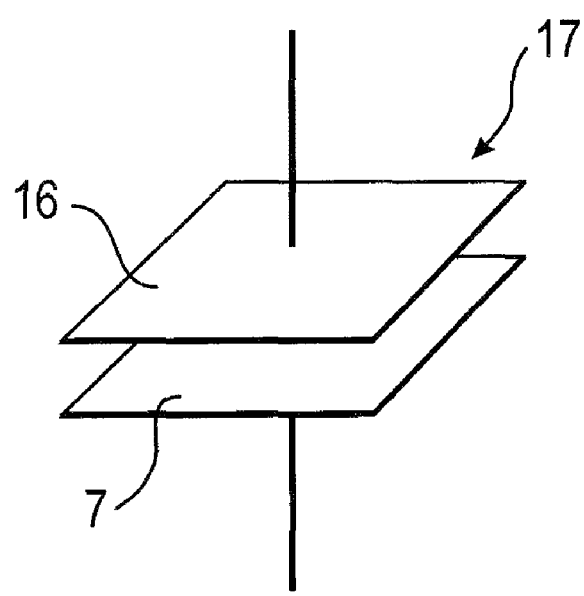

If an element, e.g. a user's finger 16 as shown in FIG. 3*a*, which has a potential different from the potential of the sensor surface 7, in particular ground potential, is brought close to or in contact with a surface region of the cover panel 2 opposite the sensor surface 7, this causes a change in the capacitance of a capacitor 17 formed from the element in question or the finger 16, the cover panel 2, and the sensor surface 7 or the sensor surface 7 together with the compression spring 8 (see FIG. 3*b*). Because the sensor surface 7 is connected in an electrically conducting manner to the circuit 14 of the proximity switch 4, the change in capacitance can be determined by the circuit 14 and can be further used to trigger a switching signal, as described in more detail below. Further, a light source 35 (see FIG. 8), e.g. an LED, may be provided on the printed board 5 in the region inside the compression spring 8 in order to identify the sensor surface 7 or to signal different switching states of the proximity switch 4.

Figure 4:
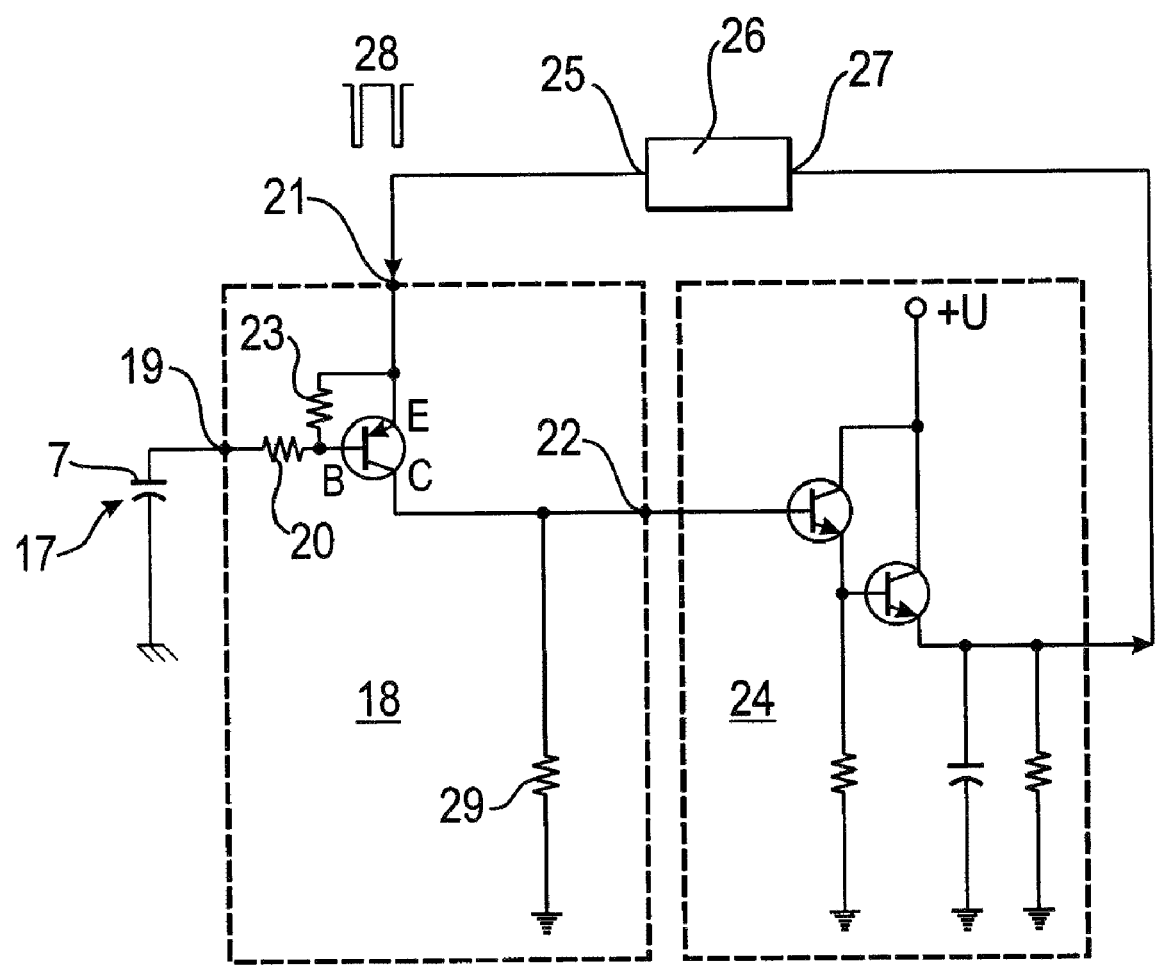
FIG. 4 shows a segment of a schematic electrical circuit of the inventive proximity switch.

FIG. 4 shows a segment of a circuit diagram of the electrical circuit 14, which has a semiconductor switch 18 in the form of a bipolar PNP transistor, to whose control input 19, in other words to whose base, the sensor surface 7 is connected via a current-limiting resistor 20. The semiconductor switch 18 further has a signal input 21, i.e. the emitter of the bipolar PNP transistor, and a signal output 22, i.e. the collector of the bipolar PNP transistor, the signal input being connected to the sensor surface 7 via a base-emitter resistor 23. The current-limiting resistor 20 and the base-emitter resistor 23 may be pre-integrated into the bipolar PNP transistor. The signal output 22 of the semiconductor switch 18 is connected to a sample and hold stage 24 of known type, for further processing of an output signal. This arrangement enables generation of a direct voltage signal proportional to the amplitude of the pulse peaks of the output signal and will not be further described here. As an alternative to the sample and hold stage 24, the signal output 22 of the semiconductor switch 18 may be connected to a known integrator circuit or a known peak voltage meter (not shown), for processing of the output signal. The signal input 21 of the semiconductor switch 18 is connected to an analog signal output 25 of a microprocessor 26, and the signal output 22 of the semiconductor switch 18 is connected to an analog signal input 27 of the microprocessor 26 via the sample and hold stage 24. Instead of the single microprocessor 26, two different microprocessors may also be used, one of which is connected to the signal input 21 of the semiconductor switch 18 and the other to the signal output 22 of the semiconductor switch 18. Alternative semiconductor switches 18 may be used, instead of the bipolar PNP transistor, for example a bipolar NPN transistor, field effect transistors (FETs), or generally any controllable semiconductor elements.

A clock signal 28 is applied to the signal input 21 of the semiconductor switch 18, being supplied for example by the analog signal output 25 of the microprocessor 26. The clock signal 28 is a rectangular periodic voltage signal which is switched regularly by the microprocessor 26 between ground potential, i.e. LOW level and the operating voltage of the circuit 14 of the proximity switch 4, i.e. HIGH level, it being possible for ground potential to differ from the earth potential of the user. The clock frequency of the clock signal 28 is preferably in the range 10-100 kilohertz. The signal output 22 of the semiconductor switch 18, in other words the collector of the bipolar PNP transistor, is at the reference potential of the sample and hold stage 24 via another resistor 29. When the clock signal 28 is at the LOW level, the signal input 21 of the semiconductor switch 18 and thus the emitter E of the bipolar PNP transistor, as well as the base-emitter resistor 23, is at ground potential. This causes the sensor surface 7 and/or the capacitor 17 to be discharged via the current-limiting resistor 20 and the base-emitter resistor 23. This means that the base B of the bipolar PNP transistor is positive with respect to the emitter E of the bipolar PNP transistor and the bipolar PNP transistor blocks. The HIGH level of the clock signal 28 following the LOW level results in the charging of the sensor surface 7 and therefore the capacitor 17 via the base-emitter resistor 23 and current-limiting resistor 20. During this charging period of the sensor surface 7 and/or the capacitor 17, there is a voltage drop at the base-emitter resistor 23. This means that the base B of the bipolar PNP transistor is negative with respect to the emitter E and the bipolar PNP transistor becomes conducting, and thus in the switching state, until the sensor surface 7 and/or the capacitor 17 becomes charged to the HIGH level of the clock signal 28. During this charging period of the sensor surface 7 and/or the capacitor 17, an output signal is applied to the resistor 29, via the clock signal 28, which is proportional to the capacitance of the sensor surface 7 and/or the capacitor 17. Thus an output signal is applied to the signal output 22 of the semiconductor switch 18, which follows the clock signal 28, and whose signal parts are proportional to the capacitance of the sensor surface 7 and/or the capacitor 17.

This output signal is converted to a direct voltage signal by means of the sample and hold stage and is applied to the analog signal input 27 of the microprocessor 26. The microprocessor 26 is configured to evaluate a temporal change in the signal parts of the direct voltage signal and thus of the output signal, e.g. with the aid of a software program. Depending on how rapidly the signal parts of the output signal, e.g. the height of the pulse peaks or the pulse widths of successive clock periods change, the microprocessor 26 can recognize an actuation of the proximity switch 4. In other words, if the signal parts change within a predetermined time period of for example 1 second, this is recognized as an actuation, but if the signal parts change more slowly, there is no actuation. In this way, the determination of an actuation of the proximity switch 4 does not depend on the absolute size of the output signal, with the result that long-term changes, e.g. due to aging processes, are eliminated.

Figure 5:
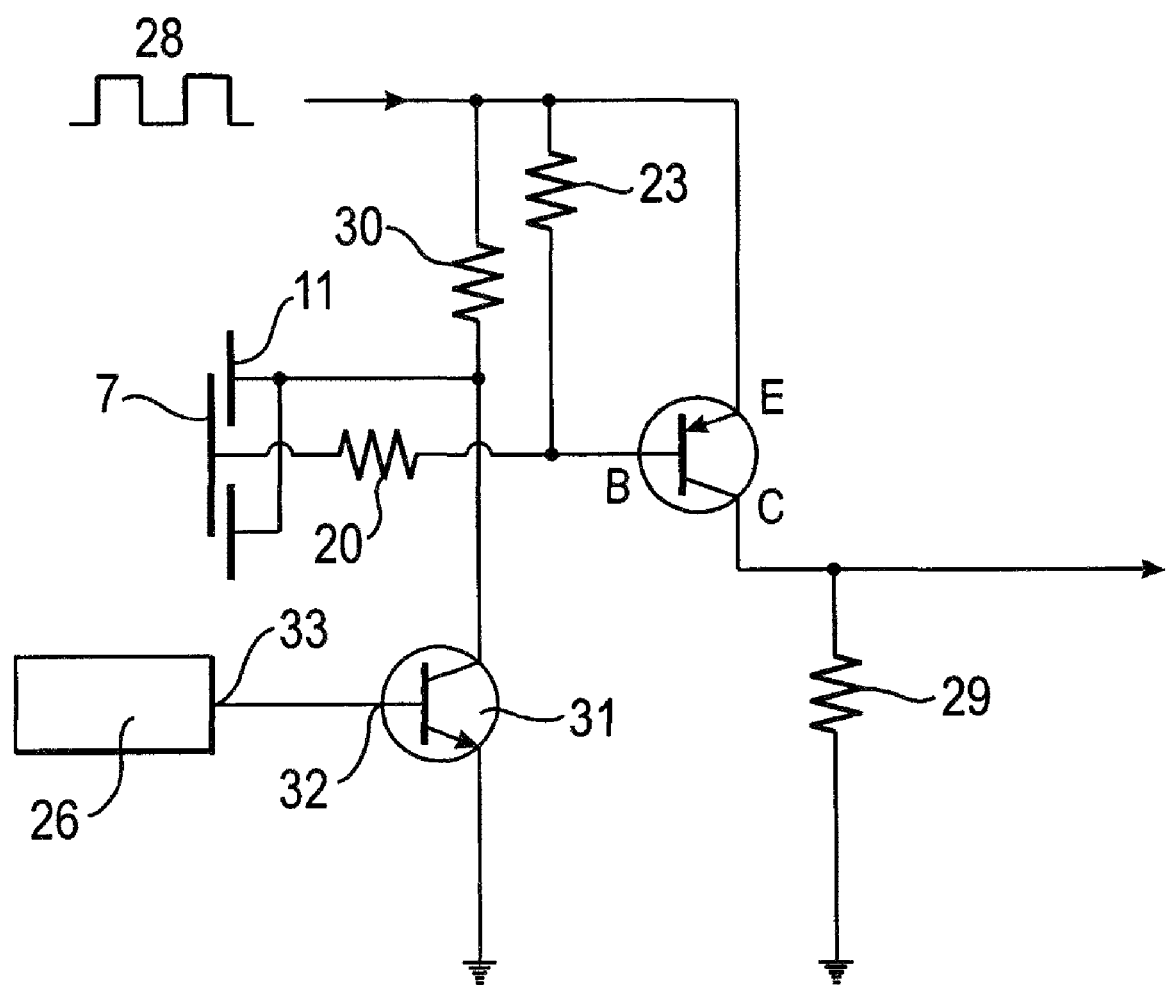
FIG. 5 shows a segment of a schematic electrical circuit of the inventive proximity switch, having active shielding.

FIG. 5 shows a segment of the electrical circuit 14 of the inventive proximity switch 4, having active shielding. The active shielding is formed by the shielding surface 11, which is connected via a low-resistance resistor 30 to the signal input 21 of the semiconductor switch 18 and to which the clock signal 28 is applied via said low-resistance resistor 30 at the same time as to the sensor surface 7. By appropriate choice of the low-resistance resistor 30, the signal form of the clock signal 28 at the shielding surface 11 can be tailored to the signal form of the clock signal 28 at the sensor surface 7, so that there is no potential difference and thereby no shifting of charge carriers between the shielding surface 11 and the sensor surface 7, thereby ensuring that the shielding surface 11 shields the sensor surface 7 against interfering capacitances.

In order to apply ground potential, the shielding surface 11 is connected to ground via a switch 31 which is a bipolar NPN transistor in the embodiment illustrated. The switch 31 has a control signal input 32, namely the base of the bipolar NPN transistor, which is connected to a control signal output 33 of the microprocessor 26. Thus the switch 31 or the bipolar NPN transistor can be switched in a simple manner by a software program of the microprocessor 26. For function testing of the proximity switch 4, i.e. to determine a reference value of the output signal, the shielding surface 11 is temporarily connected to ground potential by way of the switch 31, as a result of which the active shielding is temporarily neutralized, and actuation of the proximity switch 4 is simulated. This enables a test of whether the output signal is shifted sufficiently when the proximity switch 4 is actuated, or whether there is a malfunction, which may be attributable for example to dirt or moisture on the cover panel 2 or ambient conditions such as temperature and humidity or aging processes of the proximity switch 4. In some instances the signal shift of the output signal can be dynamically adjusted by changing the amplitude of the clock signal 28, i.e. the proximity switch 4 can be automatically calibrated, as a result of which the functional reliability of the proximity switch 4 is improved. If the reliable functioning of the proximity switch 4 is no longer ensured, as a result for example of a soiled cover panel 2, the domestic appliance 1 is automatically shut off.

The reference sensor surface 10 is connected correspondingly to the sensor surface 7. The reference sensor surface 10 is disposed adjacent to the sensor surface 7, so that the capacitance of the reference sensor surface 10 or of an open reference capacitor formed with the reference sensor surface 10 is a measure of ambient conditions, in other words interfering capacitances, and is also a measure of the influence of temperature, humidity, or aging-related material changes, on the output signal. The same clock signal 28 is applied to the reference sensor surface 10 as to the sensor surface 7, preferably in a time-multiplex method. In other words the sensor surface 7 and the reference sensor surface 10 are supplied in sequence, with different periods of the same clock signal 28. Alternatively, a further clock signal from a further analog signal output of the microprocessor 26 may also be applied to the reference sensor surface 10. The reference signal generated by the reference sensor surface 10 is considered as the base level of the output signal during the evaluation, in the microprocessor 26, of the output signal generated by the sensor surface 7, and thus serves to determine the actuation state of the proximity switch 4. In the case of domestic appliances 1, which are connected using a power mains switch, as soon as the power is turned on, the reference signal is utilized to determine whether there is actuation of the proximity switch 4.

Figure 6:
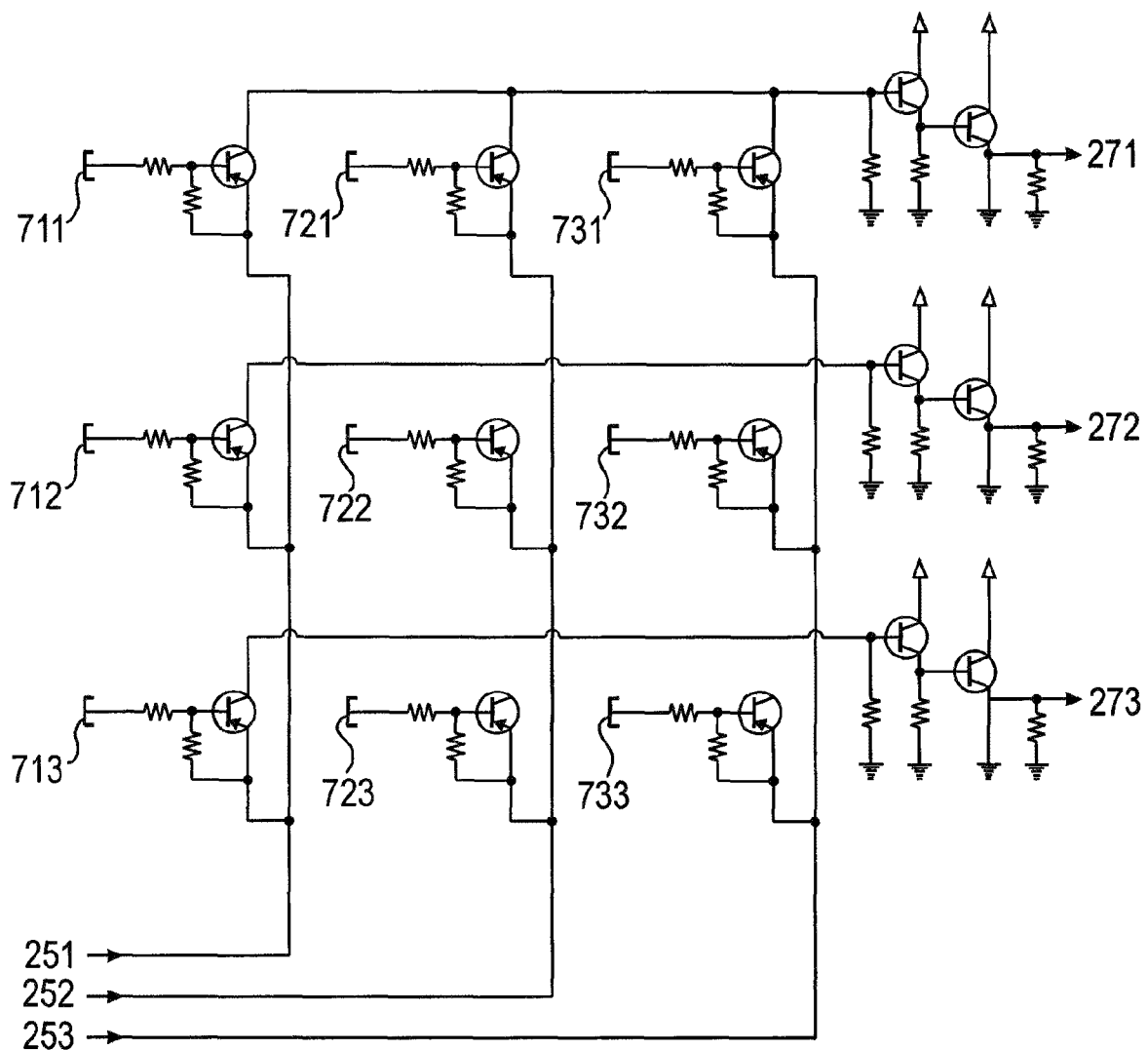
FIG. 6 shows a schematic electrical circuit of the input field according to FIG. 1, with a plurality of inventive proximity switches connected in matrix form.

FIG. 6 shows a schematic circuit 14 of the input field 3, with nine inventive proximity switches 4 connected in a 3×3 matrix for operation using a time-multiplex method. The sensor surfaces 711, 712, 713 of the first group of three proximity switches are connected to a first signal output 251 of the microprocessor 26. The sensor surfaces 721, 722, 723 of the second group of three proximity switches are connected to a second signal output 252 of the microprocessor 26. The sensor surfaces 731, 732, 733 of the third group of three proximity switches are connected to a third signal output 253 of the microprocessor 26. The sensor surfaces 711, 721, 731 are connected to a first signal input 271 of the microprocessor 26 via their respectively associated semiconductor switches and a first sample and hold stage. The sensor surfaces 712, 722, 732 are connected to a second signal input 272 of the microprocessor 26 via their respectively associated semiconductor switches and a second sample and hold stage. The sensor surfaces 713, 723, 733 are connected to a third signal input 273 of the microprocessor 26 via their respectively associated semiconductor switches and a third sample and hold stage.

The clock signal 28 is output from one of the three signal outputs 251, 252, 253 of the microprocessor 26 respectively for a predetermined time interval, i.e. a predetermined number of clock periods. The signal outputs 251, 252, 253 are alternated in sequence, with cyclic repetition of the sequence. In the time interval in which the clock signal 28 is output from one of the three signal outputs 251, 252, 253, all three signal inputs 271, 272, 273 of the microprocessor 26 are respectively evaluated. In this way it is possible to check all nine sensor surfaces 711, 712, 713, 721, 722, 723, 731, 732, 733 one after the other to determine whether a user is actuating the corresponding proximity switch using just one circuit.

Figure 7:
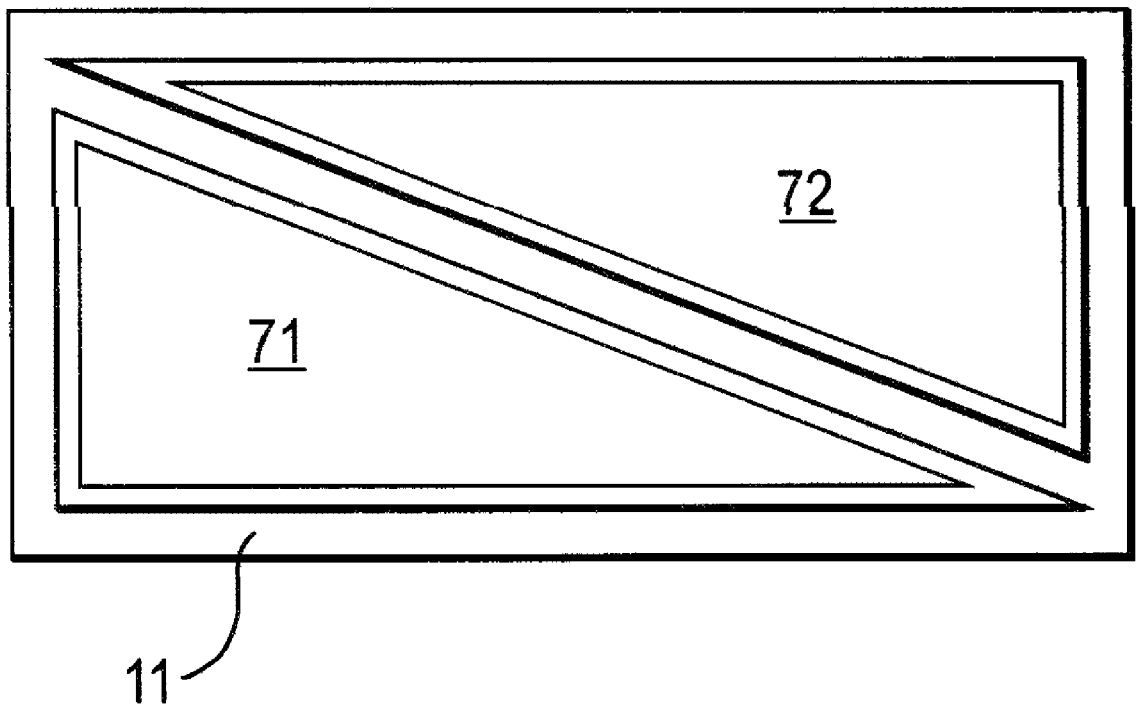
FIG. 7 shows a schematic front view of an embodiment of two sensor surfaces which form a position sensor.

FIG. 7 shows a schematic front view of an embodiment of two sensor surfaces 71, 72 which together form a position sensor. The sensor surfaces 71, 72 are configured as right-angled triangles and are disposed close to each other on a common support 5 or on the rear face of the cover panel 2, with the sensor surfaces 71 and 72 with their respective hypotenuses facing each other. The sensor surfaces 71, 72 are surrounded by a common shielding surface 11, which extends along the hypotenuses of the triangles between the sensor surfaces 71, 72. Depending on the position in relation to the lateral extension of the sensor surfaces 71, 72 in which actuation is carried out by the user, in that the user touches the cover panel 2 in the region of the sensor surface 71, 72 and therefore of the position sensor, the capacitances of the capacitors formed with the sensor surfaces 71, 72 are different due to the triangular shapes of the sensor surfaces 71, 72. The position of the actuation can thus be determined based on the output signals associated with the sensor surfaces 71, 72 and a switching state corresponding to or associated with such position is triggered. If the actuating position is changed or shifted, in that the user for example moves a finger on the cover panel 2, this change is likewise detected and a switching state corresponding to the new position is triggered. Thus the position sensor forms a slide switch without mechanically movable elements. Such a switch may be used for example to set a temperature or power setting on a hob, air conditioner or refrigerator.

Figure 8:
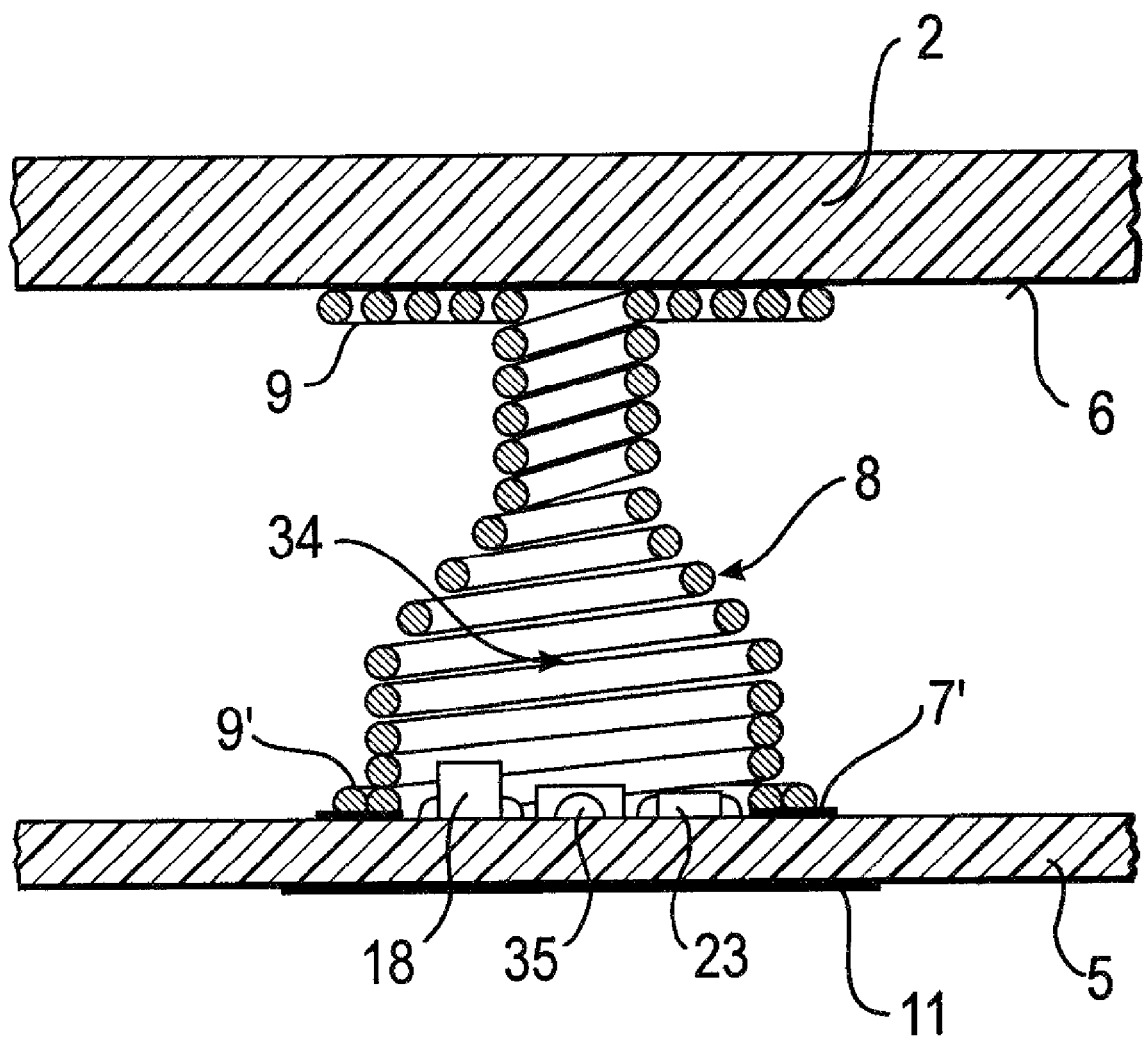
FIG. 8 shows a schematic cross-sectional view of a segment of the input field according to FIG. 1, with electronic components of the electrical circuit according to FIG. 4, which protrude into a cavity surrounded by a compression spring.

FIG. 8 shows a schematic cross-sectional view of a segment of the input field according to FIG. 1. A solder ring 7' is applied to the printed board 5, with which the coil disk 9' formed by the lower two coils of the coiled compression spring 8 is soldered to the printed board 5 and is thereby connected to the electrical circuit 14. The coils of the compression spring 8 surround a cavity 34. On the printed board 5 inside the solder ring 7' on the face of the electronic components of the electrical circuit 14 facing the cover plate 2, are disposed the bipolar PNP transistor of the semiconductor switch 18, with its base-emitter resistor 23 and its current-limiting resistor 20, as well as a light-emitting diode 35, which protrude into the cavity 34 surrounded by the compression spring 8. In order to allow electrical connection of these electronic components to the other components of the electrical circuit 14, the solder ring 7' is not completely closed but is laterally interrupted (not shown). Alternatively, the electrical connection can also be realized through the printed board 5. Together with the shielding surface 11 disposed on the rear face of the printed board 5, the compression spring 8 forms a Faraday cage for the electronic components disposed in the interior region 34 of the compression spring 8, so that these are shielded from electromagnetic fields in the surroundings.

LIST OF REFERENCE CHARACTERS

1 Domestic appliance
2 Cover panel
3 Input field
4 Proximity switch
5 Printed board
6 Rear face of cover panel
7 Sensor surface
7' Solder ring
8 Compression spring
9 Coil disk of upper coils
9' Coil disk of lower coils
10 Reference sensor surface
11 Shielding surface
12 Electronics module
13 Board
14 Circuit of proximity switch
15 Power electronics
16 User's finger
17 Capacitor
18 Semiconductor switch
19 Control input of semiconductor switch
20 Current-limiting resistor
21 Signal input of semiconductor switch
22 Signal output of semiconductor switch
23 Base-emitter resistor
24 Sample and hold stage
25 Analog signal output of microprocessor
26 Microprocessor
27 Analog signal input of microprocessor
28 Clock signal
29 Resistor
30 Low-resistance resistor
31 Switch
32 Control signal input of switch
33 Control signal output of microprocessor
34 Cavity surrounded by compression spring
35 Light-emitting diode

The invention claimed is:

1. A capacitive proximity switch, comprising:
an electrically conducting sensor surface;
an electrically insulating cover plate covering said sensor surface and forming a part of a capacitor, having a capacitance that changes on being approached;
said sensor surface having an active shielding formed by a shielding surface;
said shielding surface and said sensor surface having simultaneously applied thereto a clock signal, resulting in a potential difference between said sensor surface and said shielding surface; and
a switch connected to selectively connect said shielding surface to ground for functional testing of the capacitive proximity switch.

2. The proximity switch according to claim 1, which comprises a low-resistance resistor, and wherein the clock signal is applied to said shielding surface by way of said low-resistance resistor.

3. The proximity switch according to claim 1, wherein said switch has a control signal input connected to a control signal output of a microprocessor.

4. The proximity switch according to claim 1, wherein said switch is a transistor.

5. The proximity switch according to claim 1, wherein said shielding surface and said sensor surface are attached to a rear face of said cover plate and said shielding surface surrounds said sensor surface.

6. The proximity switch according to claim 1, which further comprises a support carrying said shielding surface and said sensor surface.

7. The proximity switch according to claim 6, wherein said shielding surface and said sensor surface are commonly disposed on a give face of said support, and said shielding surface surrounds said sensor surface.

8. The proximity switch according to claim 6, wherein said sensor surface is disposed on a front face of said support and said shielding surface is disposed on a rear face of said support, at least in a region of said sensor surface.

9. The proximity switch according to claim 6, wherein said support is a flexible printed circuit board or a copper-clad plastic film.

10. The proximity switch according to claim 6, wherein said support is disposed a spacing distance from said cover plate and an electrically conductive body is disposed between said cover plate and said support, bridging the spacing distance and being connected electrically conductively to said sensor surface and/or forming at least a part of said sensor surface with at least a portion of a surface thereof.

11. The proximity switch according to claim 10, wherein at least one electronic component is disposed on said support and protrudes into a cavity surrounded by said electrically conductive body.

12. The proximity switch according to claim 11, wherein said electronic component is a semiconductor switch and/or an illuminating element.

13. The proximity switch according to claim 10, wherein said electrically conductive body is a compression spring coiled from an extended body.

14. An input field for a domestic appliance, comprising at least one proximity switch according to claim 1.

15. The input field according to claim 14, wherein a plurality of said sensor surfaces are connected in a matrix form to operate in a multiplex method.

16. The input field according to claim 14, wherein at least two said sensor surfaces are disposed adjacent one another and together form a position sensor.

17. A domestic appliance, comprising an input field according to claim 14.

\* \* \* \* \*